United States Patent [19]

Mizuno et al.

[11] Patent Number: 4,774,298

[45] Date of Patent: Sep. 27, 1988

[54] PROCESS FOR PRODUCING BIAXIALLY ORIENTED PARAPHENYLENE SULFIDE BLOCK COPOLYMER FILM

[75] Inventors: Toshiya Mizuno; Takao Ichii; Hideyuki Yasumi; Yo Iizuka, All of Iwaki, Japan

[73] Assignee: Kureha Kagaku Kogyo Kabushiki Kaisha, Tokyo, Japan

[21] Appl. No.: 944,469

[22] Filed: Dec. 22, 1986

Related U.S. Application Data

[63] Continuation-in-part of Ser. No. 858,851, Apr. 30, 1986, which is a continuation-in-part of Ser. No. 748,464, Jun. 25, 1985, abandoned.

[30] Foreign Application Priority Data

| Jun. 29, 1984 | [JP] | Japan | 59-134633 |
| Aug. 27, 1984 | [JP] | Japan | 59-178016 |
| Aug. 27, 1984 | [JP] | Japan | 59-178017 |
| Dec. 27, 1985 | [JP] | Japan | 60-294680 |

[51] Int. Cl.$^4$ .............. B29C 47/00; B29C 55/12; B29C 55/14; C08G 75/14

[52] U.S. Cl. .............. 525/535; 264/210.2; 264/289.3; 264/290.2; 264/331.11; 428/419; 428/704; 525/537; 528/388

[58] Field of Search .............. 264/210.2, 235.8, 289.3, 264/290.2, 331.11; 428/419, 704; 524/609; 525/535, 537; 528/388

[56] References Cited

U.S. PATENT DOCUMENTS

| 3,869,434 | 3/1975 | Campbell et al. | 528/388 |
| 4,286,018 | 8/1981 | Asakura et al. | 528/388 X |
| 4,370,469 | 1/1983 | Deguchi et al. | 528/388 |
| 4,426,479 | 1/1984 | Deguchi et al. | 428/419 X |
| 4,629,778 | 12/1986 | Sugie et al. | 528/388 |

FOREIGN PATENT DOCUMENTS

| 166451 | 1/1986 | European Pat. Off. | |
| 52-12240 | 4/1977 | Japan . | |
| 55-34967 | 3/1980 | Japan | 264/290.2 |
| 55-34968 | 3/1980 | Japan | 264/290.2 |
| 55-111235 | 8/1980 | Japan . | |
| 56-62127 | 5/1981 | Japan | 264/290.2 |
| 56-62128 | 5/1981 | Japan | 264/290.2 |
| 58-208019 | 12/1983 | Japan | 264/235.8 |
| 59-5099 | 2/1984 | Japan . | |
| 59-5100 | 2/1984 | Japan . | |
| 59-22926 | 2/1984 | Japan . | |
| 61-14228 | 1/1986 | Japan . | |

Primary Examiner—Jeffery Thurlow
Assistant Examiner—Leo B. Tentoni
Attorney, Agent, or Firm—Oblon, Fisher, Spivak, McClelland & Maier

[57] ABSTRACT

Disclosed herein is a process for producing a biaxially oriented paraphenylene sulfide block copolymer film, comprising melt extruding and molding a paraphenylene sulfide block copolymer essentially composed of recurring units (A):

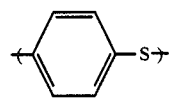

and recurring units (B):

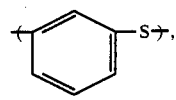

the molar fraction of recurring units (A) being 0.50–0.98, and having a melt viscosity ($\eta^*$) of 1,000–50,000 poises as measured at 310° C. and shear rate of 200 sec$^{-1}$, into a film, and after cooling, biaxially stretching the thus molded film at a stretching temperature (T) defined by the following formula:

$$96 - 50X < T < 116 - 66.7X$$

wherein T is a stretching temperature (°C.) and X is molar fraction of recurring units (B):

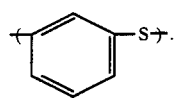

5 Claims, 2 Drawing Sheets

PROCESS FOR PRODUCING BIAXIALLY ORIENTED PARAPHENYLENE SULFIDE BLOCK COPOLYMER FILM

CROSS-REFERENCE TO RELATED APPLICATION

The present application is a continuation-in-part of application Ser. No. 858,851 filed on Apr. 30, 1986 which is a continuation-in-part of application Ser. No. 748,464 filed on June 25, 1985 abandoned.

BACKGROUND OF THE INVENTION

The present invention relates to a process for producing a biaxially oriented paraphenylene sulfide block copolymer film having a high Young's modulus. More particularly, the present invention relates to a process for producing a biaxially oriented paraphenylene sulfide block copolymer film having a high Young's modulus, comprising melting a paraphenylene sulfide block copolymer essentially composed of recurring units (A):

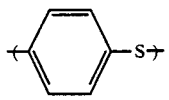

and recurring units (B):

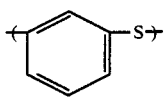

to form a film and biaxially stretching the thus obtained film at a stretching temperature (T) defined by the formula:

$$96 - 50X < T < 116 - 66.7X$$

(wherein T is stretching temperature (°C.) and X is molar fraction of recurring units (B)).

Paraphenylene sulfide polymer is known as a thermoplastic resin having high heat-resistance and high chemical-resistance and excellent electrical properties since the paraphenylene sulfide polymer can be used at its working temperature as high as nearly the crystalline melting point (about 285° C.) by crystallizing it to a high degree because of its high crystallinity (see, for instance, Japanese Patent Publication No. 52-12240 (1977), Japanese Patent Publication No. 45-3368 (1970), Japanese Patent Application Laying Open (KOKAI) No. 59-22926 (1984) and U.S. Pat. No. 3,869,434). Also, some films made of such paraphenylene sulfide polymers and the processes for producing such films have been proposed.

For instance, there have been proposed a biaxially oriented poly-p-phenylene sulfide film containing more than 90% by mole of recurring units:

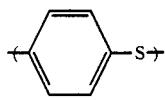

and having a density of 1.330–1.400 g/cc at 25° C., produced by melt extruding and molding a poly-p-phenylene sulfide having a melt viscosity in the range of 100–600,000 poises as measured at 300° C. and shear rate of 200 sec$^{-1}$ to form a non-crystalline (amorphous) transparent film, biaxially stretching the thus obtained film simultaneously or successively at 80°–120° C., and heat-setting the thus stretched film under tension at a temperature in the range from 180° C. to the melting point of the polymer (Japanese Patent Publication No. 59-5100 (1984)); a biaxially oriented poly-p-phenylene sulfide film having a film-to-film kinematic friction coefficient of greater than 0.75 at 20° C. and 70% RH and a film surface roughness of less than 0.9μ/5 mm on the average, obtained by producing a poly-p-phenylene sulfide containing not less than 90% by mole of recurring units:

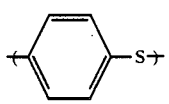

by polymerization, melt extruding and molding this polymer to form a non-crystalline (amorphous) film, biaxially stretching this film at a temperature of 80°–100° C. and heat-setting the thus biaxially stretched film at a temperature of 150°–280° C., wherein the particles of an inert inorganic material such as silica, alumina, carbon, glass, calcium carbonate, calcium phosphate or the like are added during or at the end of the polymerization, a determined amount of insoluble salt used in the polymerization is left, or the film is treated by a surface roughening roll in the film forming process or subjected to surface oxidation treatment or blast finishing with a solid matter (Japanese Patent Application Laying Open (KOKAI) No. 55-34968 (1980)); a process for producing a poly-p-phenylene sulfide film comprising melt extruding and molding poly-p-phenylene sulfide containing not less than 90% by mole of recurring units:

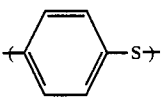

to form a substantially amorphous film, stretching this film by 2.0–5.0 times in one direction at 80°–120° C. to make the birefrigence index of the film 0.05–0.30, further stretching the thus obtained film by 1.5–5 times in the direction orthogonal to the initially stretched direction at a temperature of 80°–150° C., and heat-setting the thus treated film under tension at a temperature in the range from 180° C. to the melting point of the polymer (Japanese Patent Application Laying Open (KOKAI) No. 55-111235 (1980)); a process for producing a poly-p-phenylene sulfide film, comprising melting a poly-p-phenylene (amorphous) sulfide containing not less than 90% by mole of recurring units:

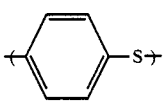

and having a melt viscosity of 100–600,000 poises as measured at 300° C. and shear rate of 200 sec$^{-1}$, extruding the melt onto a cooling medium having a surface temperature of 120° C. or below to form a film having a density of 1.320–1.330 g/cc, uniaxially stretching the thus obtained film by 3–4.7 times at 85°–100° C., then further stretching the thus stretched film by 2.7–4.5 times in the orthogonal direction to the initially oriented direction at 87°–110° C. and heat-setting the thus treated film at 200°–275° C. (Japanese Patnet Application Laying Open (KOKAI) No. 56-62128 (1981)); a biaxially oriented poly-p-phenylene sulfide film having a gradient of 0.01–1.0 kg/mm²/% at 20% elongation in the stress-strain curve when a 10 mm film piece cut out from said film in the longitudinal and transverse directions is stretched at a rate of 600%/min at 25° C., produced by melt extruding and molding a poly-p-phenylene sulfide containing not less than 90% by mole of recurring units:

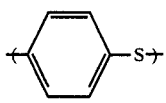

and having a melt viscosity of 300–100,000 poises as measured at 300° C. and shear rate of 200 sec$^{-1}$ to form a substantially amorphous film, biaxially stretching this film simultaneously or successively at a temperature of 80°–120° C., and heat-setting the thus stretched film under tension at a temperature in the range from 180° C. to the melting point of the polymer for 1–10 minutes (Japanese Patent Application Laying Open (KOKAI) No. 56-62127 (1981)); and a process for producing a poly-p-phenylene sulfide film comprising melt extruding and molding a poly-p-phenylene sulfide containing not less than 90% by mole of recurring units:

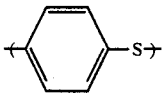

to form a non-crystalline (amorphous) poly-p-phenylene sulfide film, biaxially stretching this film at 80°–100° C., heat-setting the thus stretched film at 150°–280° C., and subjecting the thus treated film to a heat treatment at a temperature in the range below the heat-setting temperature but above 50° C. while shrinking or stretching within 20% in the longitudinal and transverse directions (Japanese Patent Publication No. 59-5099 (1981)).

Paraphenylene sulfide polymer, however, has the problem that its crystallization rate is too high in the melting work and it tends to form coarse spherulites. For instance, in case of forming a film by inflation method, the polymer is crystallized and hardened before a sufficient expansion occurs, and it is difficult to obtain a desired oriented film. Also, in case of extruding and molding the polymer into a sheet by a T-die, crystallization and hardening take place before the sheet is taken up on a take-up roll, and it is unable to obtain a flat and smooth sheet having a uniform thickness.

For overcoming these problems in working of paraphenylene sulfide polymer, there has been proposed an injection molding article, extrusion molding article or wire-coating article of a paraphenylene sulfide block copolymer essentially composed of recurring units (A):

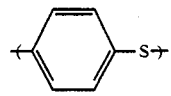

and recurring units (B):

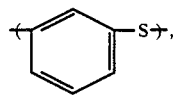

in which the recurring units A exist as a bonded block of average 20 to 5,000 units of the recurring unit (A) in the molecular chain and the molar fraction of recurring unit (A) is in the range of 0.50–0.98, said copolymer having a melt viscosity ($\eta^*$) of 50–100,000 poises as measured at 310° C. and shear rate of 200 sec$^{-1}$, a glass transition temperature (Tg) of 20°–80° C., a crystalline melting point (Tm) of 250°–285° C. and a crystallization index (Ci) of 15–45 (measured with the non-oriented heat-treated polymer film) (Japanese Patent Application Laying Open (KOKAI) No. 61-14228 (1986)).

The paraphenylene sulfide block copolymer which is essentially composed of recurring units (A):

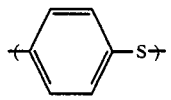

and recurring units (B):

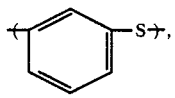

wherein the recurring units (A) exist as a bonded block of average 20–2,000 units of the recurring unit (A) in the molecular chain and the molar fraction of recurring units (A) is in the range of 0.50–0.98, and which has a melt viscosity ($\eta^*$) of 1,000–50,000 poises as measured at 310° C. and shear rate of 200 sec$^{-1}$, a glass transition temperature of 20°–80° C. and a crystalline melting point of 250°–285° C., has the same degree of crystallinity and heat resistance as paraphenylene sulfide homopolymer, is free of the problems in melt works of the homopolymer and also has a salient working characteristic that it can be well molded and worked even in a supercooling temperature range.

However, the biaxially oriented film of the paraphenylene sulfide block copolymer is not sufficiently high in Young's modulus, and thus a new proposal of a process for producing a paraphenylene sulfide block copolymer oriented film having a Young's modulus over 400 kg/mm² has been desired.

As a result of studies for overcoming the abovementioned defects, the present inventors could solve the technical problems of too high crystallization rate and coarse spherulite forming tendency of paraphenylene sulfide homopolymer, and poor heat resistance of paraphenylene sulfide random copolymer by stretching the paraphenylene sulfide block copolymer film in a specific temperature range, and it has been found that it is possible to obtain a paraphenylene sulfide block copolymer stretched film having crystallinity and heat resistance of paraphenylene sulfide homopolymer, easy melt workability of paraphenylene sulfide random copolymer and a Young's modulus higher than 400 kg/mm². The present invention was attained on the basis of this finding.

SUMMARY OF THE INVENTION

In an aspect of the present invention, there is provided a process for producing a biaxially oriented paraphenylene sulfide block copolymer film having a high Young's modulus, comprising melt extruding and molding a paraphenylene sulfide block copolymer essentially composed of recurring units (A):

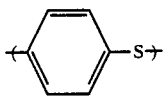

and recurring units (B):

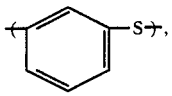

the molar fraction of said recurring units (A) being 0.50–0.98, and having a melt viscosity ($\eta^*$) of 1,000–50,000 as measured at 310° C. and shear rate of 200 sec$^{-1}$, into a film, and after cooling, biaxially stretching the thus obtained film at a stretching temperature (T) defined by the formula:

$$96 - 50X < T < 116 - 66.7X$$

(wherein T is stretching temperature (°C.), and X is molar fraction of recurring units (B):

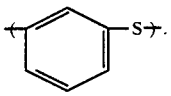

DETAILED DESCRIPTION OF THE INVENTION

Figure 1:
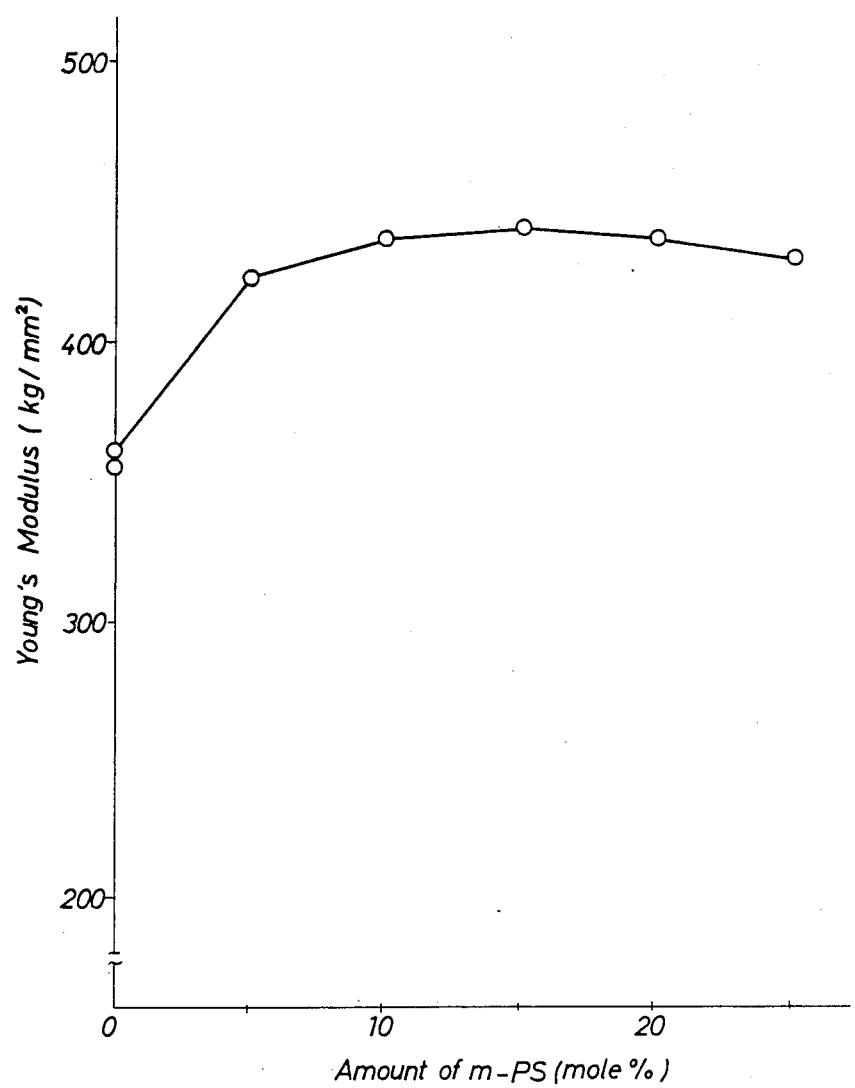
FIG. 1 is a drawing showing the relationship between the amount (mole%) of m-phenylene sulfide in a phenylene sulfide block copolymer stretched film and the Young's modulus of the film.

The polymer of the paraphenylene sulfide block copolymer oriented film according to the present invention is essentially composed of recurring units (A):

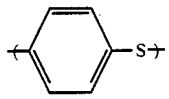

and recurring units (B):

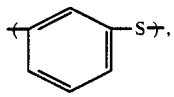

in which the recurring units (A) exist as a bonded blocks of average 20–2,000 units of the recurring unit (A) in the molecular chain and the molar fraction of recurring units (A) is in the range of 0.50–0.98, and has a melt viscosity ($\eta^*$) of 1,000–50,000 poises as measured at 310° C. and shear rate of 200 sec$^{-1}$, a glass transition temperature of 20°–80° C. and a crystalline melting point of 250°–285° C.

The crystalline p-phenylene sulfide block copolymer of the present invention is a high-molecular material having a chemical structure in which the recurring units (A):

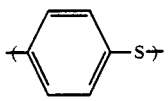

are bonded block-wise in the molecular chain.

For providing this copolymer with heat resistance based on crystallinity characteristic of p-phenylene sulfide homopolymer and with the working easeability in inflation film forming, melt extruding and molding, wire coating, melt spinning and drawing, etc., it is indispensable that the p-phenylene sulfide recurring units (A) of this copolymer be distributed in the molecular chain as bonded blocks of 20–2,000 units, preferably 40–1,500 units, more preferably 100–1,000 units on the average.

It is also necessary that the molar fraction of the recurring units (A) in the copolymer molecular chain is in the range of 0.50–0.98, preferably 0.60–0.90. When the p-phenylene sulfide recurring units are in the above-mentioned range, this copolymer has crystallinity and heat resistance equal to p-phenylene sulfide homopolymer and is also excellent in workability for inflation film forming, a melt extrusion, wire coating, melt spinning and drawing, etc.

The recurring units (B) which constitute the block copolymer with the p-phenylene sulfide recurring units (A), essentially comprise meta-phenylene sulfide recurring units:

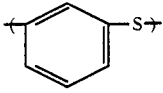

in which aromatic compound recurring units: $-(Ar-S)-$ may be contained. In this formula, Ar represents an aromatic compound residue. Typical examples of $-(AR-S)-$ may exemplify

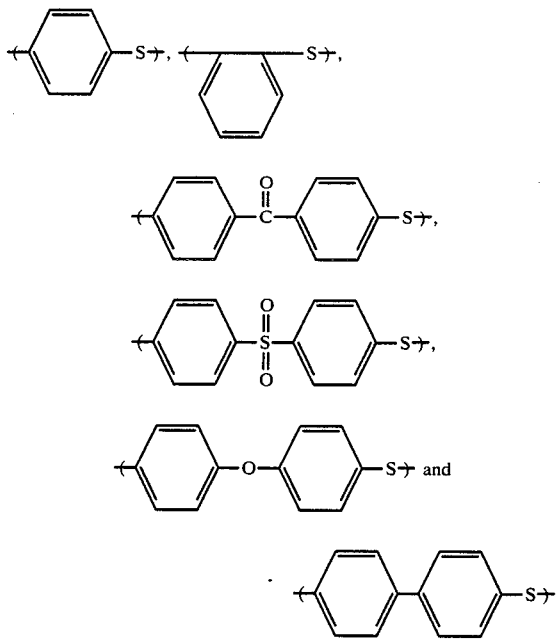

The term "essentially" is used in the present invention to signify that m-phenylene sulfide units occupy not less than 80% by mole, preferably 90 to 100% by mole of the whole recurring units (B).

The polymerization degree of the paraphenylene sulfide block copolymer of the present invention, as expressed in terms of melt viscosity ($\eta^*$), is in the range of 1,000–50,000 poises, preferably 1,050–15,000 poises. The melt viscosity ($\eta^*$) is represented as measured under the conditions of 310° C. and shear rate of 200 sec$^{-1}$ by using a Koka-type flowtester. If the melt visocity ($\eta^*$) is less than 1,000 poises, no tenacious molded product can be obtained, and if it is more than 50,000 poises, the molding work becomes difficult to carry out.

The number of the recurring units (A):

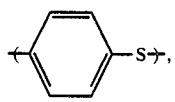

that is, the polymerization degree of poly-paraphenylene sulfide blocks in the block copolymer of the present invention can be determined by fluorescent X-ray method, and the polymerization degree of polymetaphenylene sulfide blocks (B) can be measured by gel permeation chromatography (GPC). The molar fraction of poly-paraphenylene sulfide blocks can be easily determined by infrared analysis.

Further, the paraphenylene sulfide block copolymer of the present invention has a glass transition temperature (Tg) of 20°–80° C. and a crystalline melting point (Tm) of 250°–285° C.

The paraphenylene sulfide block copolymer of the present invention is also characterized by the fact that the crystallization temperature (Tc2) on the high temperature size (viz. the temperature at which the crystallization begins when the polymer in the molten state is cooled gradually) is widely different from the crystalline melting point (Tm) and also the crystallization rate is not so high, contrastive to p-phenylene sulfide homopolymer in which Tc2 is close to Tm and the crystallization rate is very high. Therefore, the paraphenylene sulfide block copolymer of the present invention has a very advantageous working characteristic that it can be well molded and worked even in the temperature region between Tm and Tc2, that is, in the supercooling temperature range, and is thus suited for various types of working.

Tm, Tg, Tc1 and Tc2 are the values expressed by the melt peak, the temperature causing the start of heat absorption and the crystallization peak, respectively, as they were measured with 10 mg of specimen, which has been quenched from the molten state into a substantially noncrystalline (amorphous) state, under nitrogen gas atmosphere at a heating and cooling rate of 10° C./min by using a differential scanning type calorimeter mfd. by Metler Corp. (DSC Metler TA-3000).

Typical examples of the preparation process of paraphenylene sulfide block copolymer according to the present invention are shown below.

(I) A non-protonic polar organic solvent containing paradihalobenzene and an alkaline metal sulfide is heated to produce a reaction solution (C) containing a paraphenylene sulfide polymer in which the number of recurring units (A):

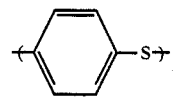

is 20–2,000 on the average (first step), and this reaction solution (C) is added with a dihalo aromatic compound substantially composed of metadihalobenzene and the thus obtained mixture is heated for effecting block copolymerization so as to obtain a paraphenylene sulfide block copolymer comprising the recurring units (A):

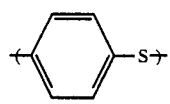

and recurring units (B):

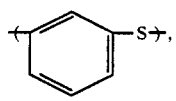

in which the molar fraction of recurring units (A) is in the range of 0.50–0.98, and having a melt viscosity ($\eta^*$) of 1,000–50,000 as measured under the conditions of 310° C. and shear rate of 200 sec$^{-1}$, a glass transition temperature (Tg) of 20°–80° C., and a crystalline melting point (Tm) of 250°–285° C.

(II) A non-protonic polar organic solvent containing a dihalo aromatic compound composed of metadihalobenzene and an alkaline metal sulfide is heated to produce a reaction solution (E) containing a metaphenylene sulfide polymer comprising recurring units (A):

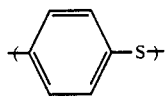

and recurring units (B):

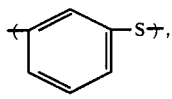

having an average polymerization degree of not less than 2 and satisfying the relation of $$\left(20 \times \frac{1-Y}{Y}\right) \sim \left(2000 \times \frac{1-Y}{Y}\right)$$

(wherein Y is the molar fraction of recurring units (A) of the produced block copolymer, of 0.50–0.98) (first step), and this reaction solution (E) is added with paradihalobenzene and the thus obtained mixture is heated for effecting block polymerization so as to obtain a paraphenylene sulfide block copolymer comprising the recurring units (B):

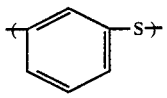

and recurring units (A):

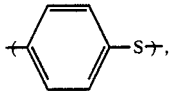

in which the molar fraction of recurring units (A) is in the range of 0.50–0.98, and having a melt viscosity ($\eta^*$) of 1,000–50,000 as measured as 310° C. and shear rate of 200 sec$^{-1}$, a glass transition temperature (Tg) of 20°–80° C., and a crystalline melting point (Tm) of 250°–285° C.

The alkaline metal sulfide used as sulfide bond supply source is preferably selected from the sulfides of such metals as Na, Li, K, Rb and the like, among which the sulfides of Na and Li are especially preferred in view of reactivity. In case such sulfide contains crystal water, it is necessary to reduce its water content by suitable means such as evaporation or drying before it is used for the polymerization reaction.

Carboxylic acid amides, organophosphoric acid amides, urea derivatives and the like can be preferably used as non-protonic polar organic solvent in the reaction, but in view of chemical and thermal stability, N-methylpyrrolidone, hexatrimethylphosphoric acid triamide, tetramethylurea and the like are especially preferred.

In the dihalo aromatic compound, paradichlorobenzene, paradibromobenzene and the like can be used as paradihalobenzene for forming the p-phenylene sulfide blocks, while dihalo substituted aromatic compounds can be used in a small quantity with the above-mentioned metadihalobenzene for forming other blocks.

Typical examples of such dihalo substituted aromatic compounds are those shown by the formulae:

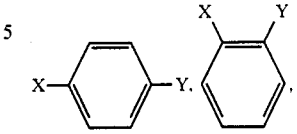

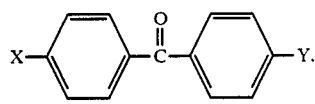

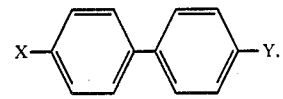

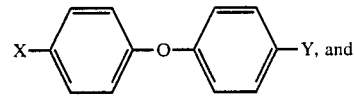

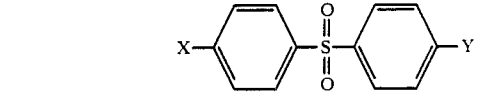

(wherein X and Y are each a halogen atom).

It is also possible to use polyfunctional compounds having three or more halogen groups such as 1,2,3- or 1,2,4-trihalobenzene.

The polymerization conditions should be selected so that a polymer having a melt viscosity ($\eta^*$) of 1,000–50,000 poises, preferably 1,050–15,000 poises, is formed.

The preparation processes will be described more particularly below.

Preparation process (I)

In case of using an alkaline metal sulfide containing crystal water as starting material, such as Na$_2$S.9H$_2$O, Na$_2$S.5H$_2$O and Na$_2$S.3H$_2$O (including those produced from an in situ reaction of NaHS.2H$_2$O+NaOH→Na$_2$S.3H$_2$O), it is preferable (i) to reduce the water content to a proper level by drying and then feed the thus dried compound into an organic solvent, (ii) to feed the alkaline metal sulfide alone into an organic solvent and heat the thus obtained mixture to about 200° C. thereby distilling off water, or (iii) to carry out chemical dehydration by adding, for example, CaO thereby properly adjusting the water content (usually 0.5–2.5 moles to one mole of sulfide). Thereafter, p-dihalobenzene is added thereto in an amount corresponding to 0.95–1.05 moles to one mole of sulfide, and the mixture is heated to a proper temperature, usually 160°–300° C., preferably 190°–260° C., to carry out polymerization reaction until the average polymerization degree of the produced p-phenylene sulfide prepolymer becomes 20–2,000, thereby forming a prepolymer-containing reacted mixture solution (C). The time required for this process is usually about 0.5–30 hours.

On the other hand, an unreacted mixture solution (D) is prepared by adding metadihalobenzene (which may contain a small quantity of dihalo substituted aromatic compound) to the starting alkali metal sulfide in an amount corresponding to 0.95–1.05 mole to one mole of sulfide, after adjusting its water content by drying, distillation in the organic solvent or chemical dehydration in the same way as described above.

The unreacted mixture solution (D) and the prepolymer-containing reaction mixture solution (C) are mixed in a proper ratio (viz. a ratio selected such that the molar fraction of paraphenylene sulfide recurring units in the produced block copolymer would become 0.50-0.98), and after re-adjusting the water content if necessary, the mixture is again heated to a proper temperature, usually 160°-300° C., preferably 200°-280° C., to carry out polymerization reaction. There can resultantly be obtained a crystalline paraphenylene sulfide block copolymer of the present invention.

The polymer can be recovered in a granular or powdery form by subjecting the thus obtained polymer to neutralization, filtration, washing and drying as desired in the conventional method.

Preparation process (II)

Assuming that the average length (polymerization degree) of the blocks of paraphenylene sulfide recurring units (A) is n, the molar fraction is Y and the average length (polymerization degree) of the blocks of recurring units (B) mainly composed of metaphenylene sulfide is m, there generally exists the following relation:

$$n{:}m = Y{:}(1-Y)$$
$$\therefore m = n \times \frac{(1-Y)}{Y}$$

Therefore, in the case of a block polymer in which n=20-2,000, there exists the relation:

$$m = \left(20 \times \frac{1-Y}{Y}\right) \sim \left(2{,}000 \times \frac{1-Y}{Y}\right)$$

(m must not be less than 2). This relation is applied in the preparation process (II).

In this process, as the case of the preparation process (I), a polar organic solvent and a starting alkaline metal sulfide are fed after properly adjusting the water content thereof, and then metadihalobenzene (which may contain a small quantity of dihalo substituted aromatic compound) is added thereto in an amount corresponding to usually 0.95-1.05 mole to one mole of sulfide. Then the mixture is heated to a proper temperature, usually 160°-300° C., preferably 190°-260° C., to carry out polymerization reaction until the average polymerization degree of the produced arylene sulfide prepolymer would become $$\left(20 \times \frac{1-Y}{Y}\right) \sim \left(2{,}000 \times \frac{1-Y}{Y}\right)$$

thereby preparing a prepolymer-containing reaction mixture solution (E).

On the other hand, an unreacted mixture solution (F) is prepared by feeding a polar organic solvent and a starting alkaline metal sulfide after adjusting the water content thereof in the same way as the preparation process (I) and then adding p-dihalobenzene thereto in an amount corresponding to usually 0.95-1.05 mole to one mole of sulfide. (As mentioned before, the essential component of the mixture solution (F) may be p-dihalobenzene alone, with no sulfide and solvent contained).

The unreacted mixture solution (F) and the prepolymer-containing reaction mixture solution (E) are mixed in a predetermined ratio, and after readjusting the water content thereof, if necessary, the mixture is again heated to a proper temperature, usually 160°-300° C., preferably 200°-280° C., to accomplish polymerization reaction, thereby obtaining a crystalline p-phenylene sulfide block copolymer of the present invention. Recovery and purification of the polymer can be performed in the same way as preparation process (I).

The thus produced polyphenylene sulfide block copolymer is melted by heating to the crystalline melting point (Tm) or higher and then molded into a sheet or film by a T-die or the like joined to a press or an extruder, and the thus molded material is cooled rapidly to produce a non-crystalline (amorphous) film or sheet. This rapid cooling is preferably conducted at a cooling rate of at least 10° C./sec to provide a transparent sheet with a crystallization degree of not more than 20%. If the cooling rate is lower than 10° C./sec, the growth of crystal is advanced and causes opacification and embrittlement of the produced film.

The thus obtained non-crystalline (amorphous) transparent sheet is uniaxially stretched or biaxially stretched simultaneously or successively by rolling or tentering at a specific temperature defined by the following formula:

$$96-50X<T<116-66.7X$$

wherein T is stretching temperature (°C.), and X is molar fraction of recurring units (B):

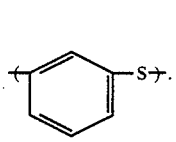

Stretching temperature is a very important factor for obtaining the paraphenylene sulfide block copolymer biaxially oriented film having a high Young's modulus of the present invention. Since the stretching temperature is affected by the molar fraction of recurring units (B):

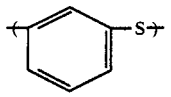

in the polyphenylene sulfide block copolymer, it is indispensable to stretch at a specific temperature defined by the above-mentioned formula in order to produce the paraphenylene sulfide block copolymer biaxially oriented film having a high Young's modulus.

For instance, in order to obtain a film having a high Young's modulus over 410 kg/mm², in case of using a polyphenylene sulfide block copolymer with a low molar fraction of recurring units (B):

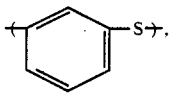

it is necessary to elevate the stretching temperature. The stretching temperature may be 83.5°–99.3° C. in case the molar fraction of recurring units (B) is 25%, but it is 93.5°–112.7° C. in case the molar fraction of recurring units (B) is 5%.

Thus, a biaxially oriented film having a high Young's modulus can be obtained by stretching at a temperature specified by the above-mentioned formula, a non-crystalline (amorphous) film of a paraphenylene sulfide block copolymer essentially composed of recurring units (A):

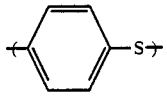

and recurring units (B):

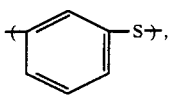

the molar fraction of recurring units (A) being 0.50–0.98, and having a melt viscosity ($\eta^*$) of 1,000–50,000 poises as measured at 310° C. and shear rate of 200 sec$^{-1}$.

The thus obtained paraphenylene sulfide block copolymer biaxially oriented film shows a Young's modulus of not less than 400 kg/mm$^2$, preferably not less than 410 kg/mm$^2$, more preferably not less than 420 kg/mm$^2$. By the way, even when a polyphenylene sulfide homopolymer film is stretched at an optimal temperature, the oriented film having the Young's modulus of only 360 kg/mm$^2$ is obtainable.

If the stretching temperature is outside the specified range, for instance, when the stretching temperature used is close to the above-mentioned specified temperature range, the obtained paraphenylene sulfide block copolymer oriented film will have a Young's modulus of only about 360 kg/mm$^2$, the same level as a Young's modulus of polyphenylene sulfide polymer oriented film. If the stretching temperature is apart from the specified temperature range, the produced stretched film will suffer from a whitening phenomenon, and if it is further apart from the specified range, the film may break during the stretching.

By stretching the film usually not less than 6 times, preferably not less than 8 times as large as the original surface area of the film, it is possible to obtain a stretched film having a high intra-facial tension of molecular chain. In the case of successive biaxially stretching, the first-stage stretching ratio is preferably not more than 5 times. If the first-stage stretching ratio is more than 5 times, there may be caused not only an increase of tension of molecular chain but also a high-degree crystallization or a whitening phenomenon which gives an adverse effect to the film in the second-stage stretching.

The drawing rate is preferably in the range of 500–20,000%/min. If it is lower than 500%/min, non-uniformity of orientation may be caused, while if the drawing rate is more than 20,000%/min, there may occur a whitening phenomenon or cut off the film.

The thus stretched film is then heat-set under tension at a temperature of preferably 200°–280° C. The heat-setting time, although variable according to the desired properties of the produced film, is usually in the range from 3 seconds to several ten minutes, preferably 3–600 seconds. By the heat-setting treatment of from 3 seconds to several ten minutes, there mainly takes place crystallization and a thermally stabilized film can be obtained. If the heat-setting time is longer than the above-mentioned range, there may take place undesirable phenomena such as excessive coloration or embrittlement of the film.

The present invention provides a process for producing a paraphenylene sulfide block copolymer oriented film having a high Young's modulus, and the paraphenylene sulfide block copolymer oriented film produced according to the process of the present invention has a Young's modulus of not less than 400 kg/mm$^2$, preferably not less than 410 kg/mm$^2$, more preferably not less than 420 kg/mm$^2$.

The present invention will hereinafter be described according to the examples thereof. These examples, however, are merely illustrative and not limitative of the scope of the invention.

SYNTHESIS EXAMPLE 1

8.0 kg of N-methylpyrrolidone (NMP) and 21.0 moles of Na$_2$S.5H$_2$O were supplied into a 20-liter polymerization pressure vessel and heated to about 200° C. to distil off water (loss of S=1.5 mol%; water in the vessel=28 moles). Then 20.1 moles of m-dichlorobenzene (m-DCB) and 3.1 kg of NMP (calcd. Na$_2$S concentration in the mixed solution=1.342 mol/kg) were supplied thereto, and after the vessel atmosphere replacement with N$_2$, the mixture was polymerized at 220° C. for one hour and then further reacted at 230° C. for 9 hours to prepare a reaction mixture solution (E-1). This solution was taken out from the vessel and stored.

A small amount of (E-1) solution was sampled out and the polymerization degree of the produced m-phenylene sulfide prepolymer was measured (by GPC method). The polymerization degree was 30.

8.0 kg of NMP and 20.0 moles of Na$_2$S.5H$_2$O were fed into a 20-liter polymerization pressure vessel and heated to about 200° C. to distil off water (loss of S=1.5 mol%; water in the vessel=26 moles). Then 20.1 moles of p-dichlorobenzene (p-DCB), 3.55 moles of water and 2.75 kg of NMP were supplied thereto, and the mixture was cooled under stirring. The Na$_2$S concentration in the mixed solution was 1.325 mol/kg. After repeating the similar operation 5 times more, the solution was taken out from the vessel and mixed well to prepare an unreacted mixture solution (F-1).

The reaction mixture solution (E-1) and unreacted mixture solution (F-1) were supplied in a ratio of 2.25 kg (E-1) to 12.55 kg (F-1) into a 20-liter polymerization pressure vessel, and the mixture was reacted at 215° C. for 10 hours, then 1.24 kg of water was added thereto and the thus obtained mixture was further reacted at 260° C. for 5 hours.

The thus obtained reaction mixture was filtered, washed with hot water and dried under reduced pressure to obtain the block copolymer.

The molar fraction (X) of the recurring units:

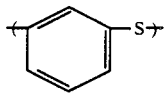

block copolymer were also determined by using this sample.

The results of determinations are shown in Table 1.

TABLE 1

| Synthesis Example No. | Amount of reaction mixture solution (E-1)(kg) | Amount of unreacted mixture solution (F-1)(kg) | Mole % of 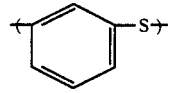 in block copolymer | Block length of recurring units (A) | Properties of polymer | | | | |
|---|---|---|---|---|---|---|---|---|---|
| | | | | | $\eta^*$ | Tg | Tm | Tc1 | Tc2 |
| 1 | 2.25 | 12.55 | 15 | 170 | 2400 | 72 | 276 | 128 | 201 |
| 2 | 0.75 | 14.76 | 5 | 570 | 2350 | 82 | 277 | 131 | 214 |
| 3 | 1.50 | 13.29 | 10 | 270 | 2100 | 76 | 277 | 134 | 209 |
| 4 | 3.00 | 11.81 | 20 | 120 | 2300 | 69 | 275 | 134 | 192 |
| 5 | 3.75 | 11.07 | 25 | 90 | 1050 | 65 | 274 | 123 | 187 |
| 6 | — | — | 15 | 105 | 1100 | 71 | 275 | 130 | 198 | in the blocks, as measured by infrared analysis, was 0.15. The melt viscosity ($\eta^*$) as measured at 310° C. and shear rate of 200 sec$^{-1}$ by using a Koka type flowtester was 2,400 poises.

SYNTHESIS EXAMPLES 2-5

The same procedure as Synthesis Example 1 was carried out except that the polymerization of reaction mixture solution (E-1) and unreacted mixture solution (F-1) was carried out by changing their amounts as shown in Table 1.

SYNTHESIS EXAMPLE 6

15.0 kg of the unreacted mixture solution (F-1) used in Synthesis Example 1 was supplied into a 20-liter polymerization pressure vessel and polymerized at 210° C. for 10 hours to prepare a reaction mixture solution (C-1), and this solution was taken off from the vessel and stored. A small amount of the (C-1) solution was sampled out and the polymerization degree of the produced p-phenylene sulfide prepolymer was determined by fluorescent X-ray method. It was 105.

8.0 kg of NMP and 21.0 moles of Na$_2$S.5H$_2$O were supplied into a 20-liter polymerization pressure vessel, and heated to about 200° C. to distill off water (loss of S=1.5 mol%; water in the polymerizer=28.5 moles). Then 20.685 moles of m-dichlorobenzene (m-DCB) and 3.0 kg of NMP were supplied thereto, and the mixture was cooled under stirring to prepare an unreacted mixture solution (D-1). This solution was taken off from the vessel and stored. The Na$_2$S concentration in the solution was 1.344 mol/kg.

The reaction mixture solution (C-1) and unreacted mixture solution (D-1) were supplied in a ratio of 12.83 kg (C-1) to 2.25 kg (D-1) into a 20-liter polymerization pressure vessel, and the mixture was reacted at 225° C. for 10 hours. Then 1.28 kg of water was added and the mixture was further reacted at 260° C. for 5 hours. The reaction mixture was filtered, washed with hot water and dried under reduced pressure to obtain the block copolymer.

Each of the obtained block copolymers was melted at a temperature higher by about 30° C. than the melting point and pressed by a high-temperature press, followed by rapid cooling with water to form a 0.1-0.2 mm thick film. By using the thus obtained film as sample, the copolymer composition was determined by infrared analysis (FT-IR method). Tg, Tm, Tc1 and Tc2 of each

SYNTHESIS EXAMPLE 7

8.0 kg of NMP and 21.4 moles of Na$_2$S.5H$_2$O were supplied into a 20-liter polymerization pressure vessel, and the mixture was heated to about 200° C. to distill off water in the same way as Synthesis Example 1. Then 3.19 kg of p-DCB, 3.17 kg of NMP and 0.08 kg of water were added, and the mixture was polymerized at 210° C. for 10 hours, and then added with 1.29 kg of water. The thus obtained mixture was further reacted at 260° C. for 5 hours. The resulting reaction mixture was filtered, washed with water and acetone and dried under reduced pressure to obtain poly-paraphenylene sulfide (PPS). The melt viscosity ($\eta^*$) of this PPS was 2,400 poises.

SYNTHESIS EXAMPLE 8

The same procedure as Synthesis Example 7 was carried out except that the amount of p-DCB supplied was 3.13 kg to obtain poly-paraphenylene sulfide (PPS). This PPS had a melt viscosity ($\eta^*$) of 4,300 poises.

EXAMPLES 1-6 & COMPARATIVE EXAMPLES 1-2

The polyphenylene sulfide block copolymers containing recurring units:

in an amount of 5%, 10%, 15%, 20%, 25% and 15%, respectively, obtained in Synthesis Examples 1-6 and the poly-paraphenylene sulfides obtained in Synthesis Examples 7-8 were extruded onto a 80°-90° C. casting roll by a 35 mm extruder provided with a hard chromium-plated screw at a resin temperature of 305° C. to form 150 μm thick T-die sheets.

Each of these sheets was biaxially stretched 3.5 times in the longitudinal and transverse directions simultaneously at the stretching temperatures shown in Table 2 at a drawing rate of 2,000 %/min and preheating time of one-minute by using a film stretcher made by T. M. Long & Inc. Each of the thus obtained stretched films was fixed to a metal frame and heated at 260° C. for 10 minutes to obtain a transparent biaxially oriented film. The film thickness was about 13 μm.

The Young's modulus of the obtained films was expressed by storage elastic modulus determined by using Reovaiburon (mfd. by Toyo Bawldwin Co., Ltc.) at 25° C. and a frequency of 3.5 Hz.

The stretching temperatures used for biaxially stretching the films and their determined values of Young's modulus (kg/mm$^2$) are shown in Table 2.

As seen from Table 2, in the case of paraphenylene sulfide homopolymer (PPS) films, the Young's modulus is about 360 kg/mm$^2$ at highest no matter at what temperature the sheet is stretched, while in the case of paraphenylene sulfide block copolymer films, when the paraphenylene sulfide block copolymer films are stretched in the specific temperature range (defined by the above-mentioned formula), the obtained biaxially oriented films show a high Young's modulus not less than 400 kg/mm$^2$, preferably not less than 410 kg/mm$^2$, more preferably not less than 420 kg/mm$^2$.

In case the block copolymer films of Synthesis Examples 1-6 are stretched at a temperature outside but close to the above-mentioned specific temperature range, the oriented films have a Young's modulus of only about 360 kg/mm$^2$ at highest. When the stretching temperature parts away from the specific range, there occurs a whitening phenomenon much or less, and when the stretching temperature is widely apart from the specific range, the film breaks or rips during stretching and it becomes unable to stretch further more.

Figure 2:
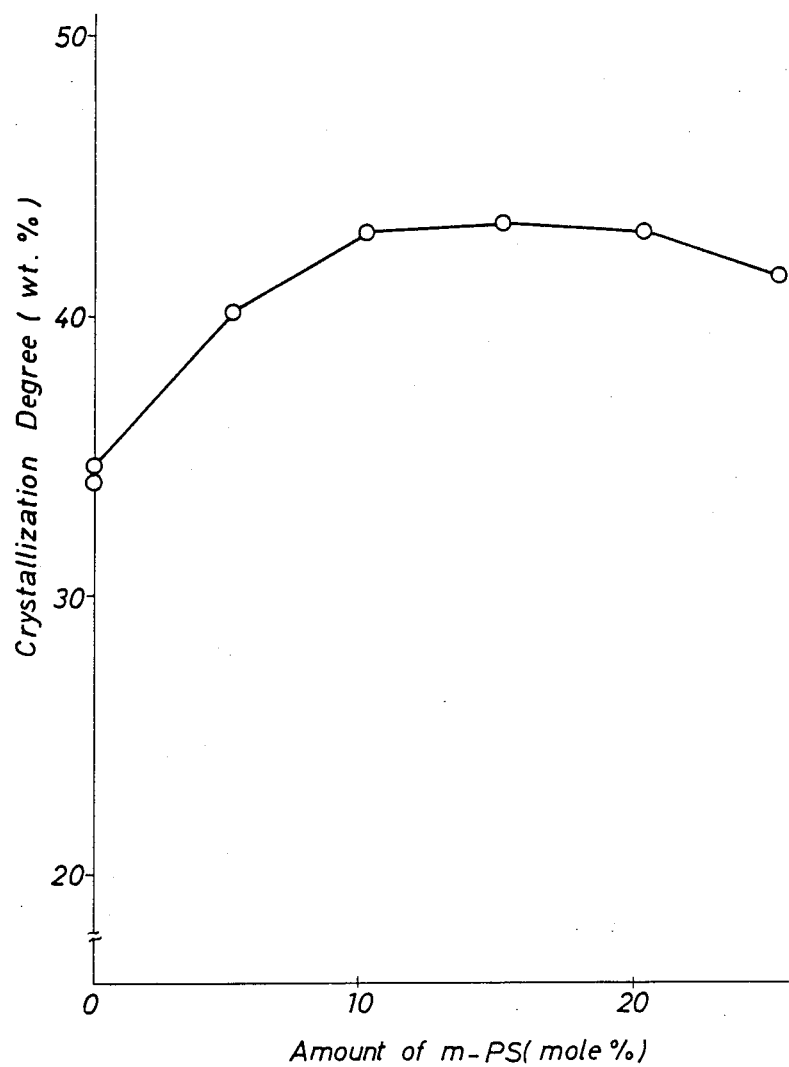
FIG. 2 is a drawing showing the relationship between the amount (mole%) of m-phenylene sulfide in a phenylene sulfide block copolymer stretched film and the crystallization degree (wt%).

Table 3 shows the highest Young's modulus of the oriented films produced in Synthesis Examples 1-8, along with stretching temperature and crystallization degree. FIGS. 1 and 2 show the relation between the molar fraction of recurring units:

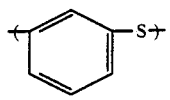

of the respective block copolymers and the Young's modulus and crystallization degree shown in Table 3.

As seen from these tables and figures, when the paraphenylene sulfide block copolymer films of the present invention are oriented in the specific temperature range defined by the above-mentioned formula, the thus obtained biaxially oriented films have a higher Young's modulus and a higher crystallization degree than when the paraphenylene homopolymer films are stretched in the specific temperature range.

TABLE 2

| | | Mole % of recurring units ⟨⌬⟩-S₊ | Melt viscosity ($\eta^*$)(poises) | Stretching temperature (°C.) | | | | | | | | |
|---|---|---|---|---|---|---|---|---|---|---|---|---|
| | | | | 80 | 85 | 90 | 95 | 100 | 105 | 110 | 115 | 120 |
| Example 1 | Synthesis Example 2 | 5 | 2350 | * | * | 365 | 420 | 425 | 420 | 420 | 360 | * |
| Example 2 | Synthesis Example 3 | 10 | 2100 | * | 360 | 365 | 420 | 420 | 400 | 360 | 300 | * |
| Example 3 | Synthesis Example 1 | 15 | 2400 | * | 365 | 430 | 430 | 430 | 410 | 360 | 290 | * |
| Example 4 | Synthesis Example 4 | 20 | 2300 | * | 360 | 420 | 440 | 430 | 365 | 310 | * | * |
| Example 5 | Synthesis Example 5 | 25 | 1050 | 360 | 420 | 430 | 410 | 350 | 290 | * | * | * |
| Example 6 | Synthesis Example 6 | 15 | 1100 | * | 360 | 365 | 430 | 440 | 400 | 360 | 340 | * |
| Comp. Example 1 | Synthesis Example 7 | 0 | 2400 | * | * | * | * | 350 | 360 | 330 | 310 | * |
| Comp. Example 2 | Synthesis Example 8 | 0 | 4300 | * | * | * | 330 | 350 | 360 | 350 | 320 | * |

(Note): *indicates that the stretching could not be performed at the specified temperature.

TABLE 3

| | | Mole % of recurring units ⟨⌬⟩-S₊ | Melt viscosity ($\eta^*$)(poises) | Crystalline melting temp. (Tm) (°C.) | Stretching temp. (°C.) | Young's modulus (kg/mm$^2$) | Crystallization degree (wt %) |
|---|---|---|---|---|---|---|---|
| Example 1 | Synthesis Example 2 | 5 | 2350 | 277 | 100 | 425 | 40 |
| Example 2 | Synthesis Example 3 | 10 | 2100 | 277 | 100 | 420 | 43 |
| Example 3 | Synthesis Example 1 | 15 | 2400 | 276 | 95 | 430 | 43 |
| Example 4 | Synthesis Example 4 | 20 | 2300 | 275 | 95 | 440 | 43 |
| Example 5 | Synthesis Example 5 | 25 | 1050 | 274 | 90 | 430 | 42 |
| Example 6 | Synthesis Example 6 | 15 | 1100 | 275 | 95 | 430 | 43 |
| Comp. Example 1 | Synthesis Example 7 | 0 | 2400 | 279 | 105 | 360 | 35 |
| Comp. | Synthesis | 0 | 4300 | 279 | 105 | 360 | 34 |

TABLE 3-continued

| Mole % of recurring units 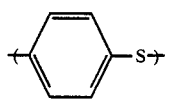 | Melt viscosity (η*)(poises) | Crystalline melting temp. (Tm) (°C.) | Stretching temp. (°C.) | Young's modulus (kg/mm²) | Crystallization degree (wt %) |
|---|---|---|---|---|---|
| Example 2 Example 8 | | | | | |

The crystallization degree of the film was determined by the following method.

CRYSTALLIZATION DEGREE OF FILM

The density of the film was measured at 25° C. by using a zinc chloride-water system density gradient tube.

Crystal density and non-crystal density of p-phenylene sulfide polymers have been determined to be 1.43 and 1.32, respectively, by B. J. Tabor (European Polymer Journal, 7, 1127 (1971)). Since it was confirmed by X-ray diffraction that the crystal system of block copolymers and the crystal system of p-phenylene sulfide homopolymers are the completely same, the crystal density of both polymers was given as 1.43. The p-phenylene sulfide polymer and m-phenylene sulfide polymer are slightly different in density of non-crystal portion, and it is also considered that such density differs according to the difference in state of orientation, but it was here assumed that the density of non-crystal portion is the same in both polymers, and the value of 1.32 reported by B. J. Tabor was adopted. By using these values, the crystallization degree was decided from the measured density of each film by the following formula:

$$\text{Crystallization degree} = \frac{\rho_c}{\rho}\left(\frac{\rho - \rho_a}{\rho_c - \rho_a}\right)$$

$$= 13\left(1 - \frac{1.32}{\rho}\right)$$

(where ρ: density of specimen; $\rho_c = 1.43$, $\rho_a = 1.32$).

COMPARATIVE EXAMPLE 3

The same process as Synthesis Example 7 was carried out except that 2.711 kg of p-DCB and 0.479 kg of m-DCB were used in place of 3.19 kg of p-DCB to obtain a random copolymer in which the molar ratio of recurring units:

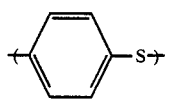

to recurring units:

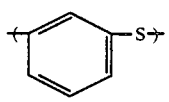

was 85/15. The melt viscosity of the thus obtained random copolymer was 1,550 poises.

By using this random copolymer, a T-die sheet was made with the same apparatus and under the same conditions as in Example 1, and the sheet was biaxially stretched 3.5 times in the longitudinal and transverse directions simultaneously at a drawing rate of 2,000 %/min and at the optimal stretching temperature 90° C. to obtain a biaxially stretched film. The thus obtained film was fixed to a metal frame and subjected to heat-setting at 160° C. for 10 minutes, but the film broke in the course of this operation and could not be heat-set. By heat-setting at 140° C. for 10 minutes, a slightly whitened film was obtained, but the crystallization degree of this film was only 21 wt%, and its Young's modulus was 299 kg/mm².

What is claimed is:

1. A process for producing a biaxially oriented paraphenylene sulfide block copolymer film having a high Young's modulus, comprising melt extruding and molding a paraphenylene sulfide block copolymer consisting essentially of recurring units (A):

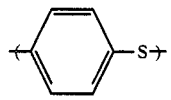

and recurring units (B):

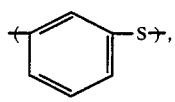

said recurring units (A) being present in the form of a block of 20 to 5,000 units of (A) on the average in the molecular chain, the molar fraction of recurring units (A) being 0.50-0.98, and having a melt viscosity (η*) of 1,000-50,000 poises as measured at 310° C. and shear rate of 200 sec⁻¹, into a film, and after cooling, biaxially stretching the thus molded film at a stretching temperature (T) defined by the following formula:

$$96 - 50X < T < 116 - 66.7X$$

wherein T is stretching temperature (°C.), and X is molar fraction of recurring units (B).

2. The process according to claim 1, wherein the cooling of the molded film of paraphenylene sulfide block copolymer is carried out at a cooling rate of at least 10° C./sec.

3. The process according to claim 1, wherein the molded film is biaxially stretched not less than 6 times as large as the original surface area.

4. The process according to claim 1, wherein said biaxial stretching is carried out at a drawing rate of 500-20,000%/min.

5. A biaxially oriented paraphenylene sulfide block copolymer film produced by the process of claim 1, said film having a Young's modulus of not less than 400 kg/mm².

* * * * *